United States Patent
Baumann et al.

(10) Patent No.: US 6,420,089 B1
(45) Date of Patent: Jul. 16, 2002

(54) ON PRESS DEVELOPABLE PRINTING PLATE PRECURSOR

(75) Inventors: Harald Baumann, Osterode; Udo Dwars, Herzberg, both of (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/568,673

(22) Filed: May 11, 2000

(30) Foreign Application Priority Data

May 12, 1999 (DE) .......................................... 199 22 197

(51) Int. Cl.$^7$ .................................................. G03F 7/11
(52) U.S. Cl. .................................. 430/273.1; 430/278.1
(58) Field of Search ...................... 430/273.1

(56) References Cited

U.S. PATENT DOCUMENTS

| | | | | |
|---|---|---|---|---|
| 3,458,311 A | | 7/1969 | Alles ............................ | 96/35.1 |
| 4,072,527 A | | 2/1978 | Fan ............................. | 96/87 R |
| 4,072,528 A | | 2/1978 | Bratt ........................... | 96/87 R |
| 4,950,577 A | * | 8/1990 | Grieve et al. .................. | 430/273.1 |
| 5,028,792 A | * | 7/1991 | Mullis .......................... | 430/338 |
| 5,258,263 A | | 11/1993 | Cheema et al. ................ | 430/309 |
| 5,273,862 A | | 12/1993 | Zertani et al. ................. | 430/273.1 |
| 5,368,973 A | | 11/1994 | Hasegawa ..................... | 430/138 |
| 5,407,764 A | | 4/1995 | Cheema et al. ................ | 430/15 |
| 5,514,522 A | | 5/1996 | Fitzgerald et al. ............. | 430/284.1 |
| 5,516,620 A | | 5/1996 | Cheng et al. .................. | 430/138 |
| 5,607,816 A | | 3/1997 | Fitzgerald et al. ............. | 430/271.1 |
| 5,620,827 A | | 4/1997 | Cheng et al. .................. | 430/138 |
| 5,677,108 A | | 10/1997 | Chia et al. .................... | 430/273.1 |
| 5,677,110 A | | 10/1997 | Chia et al. .................... | 430/302 |
| 5,811,220 A | | 9/1998 | Cheng et al. .................. | 430/302 |
| 5,922,508 A | | 7/1999 | Zertani et al. ................. | 430/273.1 |

FOREIGN PATENT DOCUMENTS

| | | |
|---|---|---|
| DE | 19732902 | 2/1999 |
| EP | 0275147 | 7/1988 |
| EP | 0352630 | 1/1990 |
| EP | 0403096 | 12/1990 |
| EP | 0465034 | 1/1992 |
| EP | 0768172 | 4/1997 |
| EP | 0769724 | 4/1997 |
| EP | 0771645 | 5/1997 |
| EP | 0778499 | 6/1997 |
| EP | 0889341 | 1/1999 |
| EP | 0354475 | 2/1999 |
| WO | 9634315 | 10/1996 |

OTHER PUBLICATIONS

English Abstract for DE 19732092 C1 Given Appl. No. DE 1032092A,. Dated Dec. 17, 1998.

* cited by examiner

Primary Examiner—Cynthia Hamilton
(74) Attorney, Agent, or Firm—Baker Botts L.L.P.

(57) ABSTRACT

The present invention relates to a printing plate precursor with an overcoat, where the printing plate precursor is preferably developable on a printing press after imagewise exposure. The printing plate precursor comprises the following components:

(a) at least one polymeric organic binder, soluble in water or in organic solvents having a water content of at least 50 wt.-% based on the total solvent content, (b) at least one radiation-absorbing component wherein the absorption maximum with the longest wavelength of the radiation-absorbing component of the overcoat is at or below 550 nm, the radiation-absorbing component absorbs in the range on the long wavelength side of the maximum of the absorption band of the photoactive system of the printing plate precursor and the difference between the absorption maximum with the longest wavelength of the radiation-absorbing component of the overcoat and the absorption maximum with the longest wavelength of the radiation-absorbing layer of the printing plate precursor is in the range of 5 to 200 nm, and (c) optionally at least one additive selected from an adhesive, a wetting agent, an inhibitor, a filler, a plasticizer, a flow improver, a thickener and an antifoaming agent.

12 Claims, No Drawings

ON PRESS DEVELOPABLE PRINTING PLATE PRECURSOR

CROSS REFERENCE TO RELATED APPLICATIONS

This application claims priority from German Patent Application No. 19922179.9, filed on May 12, 1999.

FIELD OF THE INVENTION

The present invention relates to printing plate precursors which can be processed under daylight or similar conditions; in particular on press developable printing plate precursors.

BACKGROUND OF THE INVENTION

During the last few years, the practical requirements for printing plates have been increasing continuously. So far, the bulk of printing forms is being produced by an image-wise exposure step followed by subsequent chemical development. In the past few years, printing forms were introduced to the market which are developed directly on the press by means of applying a fountain solution and printing ink (and paper), i.e. in negative working printing forms the non-exposed areas of the photosensitive layer are removed by applying the fountain solution, printing ink and paper while in positive working printing forms the exposed areas are removed. This considerably facilitates the manufacture of the printing forms and saves costs for the purchase and disposal of developing chemicals. Such on press developable printing forms are described for example in EP-A-768 172, EP-A-771 645, EP-A-778 499, EP-A-769 724, U.S. Pat. Nos. 5,258,263, 5,514,522, 5,620,827, 5,516,620, 5,407,764, 5,607,816, 5,677,110, 5,677,108, 5,811,220, 5,368,973 and WO 96/34315.

Most of the described on press developable printing forms are sensitive to light in the near-ultraviolet range. Due to this sensitivity in the proximity of the visible spectral range, the portion of short-wave radiation contained in daylight or daylight-like light sources, such as white fluorescent tubes, partially exposes the printing forms and thus renders them useless. Therefore, these printing forms have to be handled under yellow light or should only be exposed to white light for a very short period of time. These restrictions are not acceptable to users who develop the printing form on press. There is therefore a strong demand for printing forms which can be processed under daylight or similar conditions and which can be developed on press.

In practical applications, attempts have been made to allow the processing of printing forms under daylight or similar conditions by selecting photoactive components whose spectral absorption in the near-ultraviolet range is limited, for example WO 96/34315. However, there are limits to this method. Powerful light sources for UV exposure emit in the range of from 350 to 430 nm, i.e. directly on the short-wave border of the visible spectral range, and the radiation-absorbing components in printing forms generally possess relatively wide absorption bands. Thus, if the radiation-absorbing system of the printing form is selected such that it falls within the emission range of the radiation source of from 350 to 430 nm, the material cannot be processed under daylight or similar conditions since it will be pre-exposed. In order to safely exclude the influence of daylight, the absorption maximum of the photoactive component has to be clearly below 350 nm. However, as a consequence, there is only a slight overlap between absorption of the printing form and emission of the radiation. This means that only little energy can be absorbed by the printing form and the printing form has a low light sensitivity. This entails long exposure times which is undesired in practical applications.

It is therefore an object of the present invention to provide a printing form precursor which can be processed under daylight or similar conditions and which at the same time possesses a high degree of light sensitivity.

In particular, it is an object of the present invention to provide printing form precursors for offset printing which can be processed under daylight or similar conditions and which possess a high degree of light sensitivity without affecting other properties such as developability, ink acceptance and storage stability.

It is a special object of the present invention to provide printing form precursors for offset printing which can be developed on the printing press by means of a fountain solution and ink (and paper), which can be processed under daylight or similar conditions while avoiding a marked decrease in the light sensitivity of the printing form precursor or other negative properties such as impaired developability, ink acceptance and storage stability.

SUMMARY OF THE INVENTION

According to the present invention, this object is achieved by the use of an overcoat on the radiation-sensitive layer wherein the overcoat comprises
(a) at least one polymeric organic binder, soluble in water or in organic solvents having a water content of at least 50 wt.-% based on the total solvent content,
(b) at least one radiation-absorbing component wherein the absorption maximum with the longest wavelength of the radiation-absorbing component of the overcoat is at or below 550 nm, the radiation-absorbing component absorbs in the range of the flank with the longest wavelength of the absorption band of the photoactive system of the printing plate precursor and the difference between the absorption maximum with the longest wavelength of the radiation-absorbing component of the overcoat and the absorption maximum with the longest wavelength of the radiation-absorbing layer of the printing plate precursor is in the range of 5 to 200 nm, and
(c) optionally at least one additive selected from an adhesive, a wetting agent, an inhibitor, a filler, a plasticizer, a flow improver, a thickener and an anti-foaming agent.

DETAILED DESCRIPTION OF THE INVENTION

Overcoats on organic radiation-sensitive layers of printing form precursors are in principle known, e.g. U.S. Pat. No. 3,458,311. They are used as temporary coatings for offset printing plate precursors, letterpress plates, screen printing forms, printed circuit boards, reliefs etc. In these applications, the overcoats have the function of protecting the radiation-sensitive layer from atmospheric oxygen during storage, exposure and particularly between exposure and subsequent processing (developing and the like). During that time, the temporary coating has to adhere sufficiently to the radiation-sensitive layer in order to guarantee safe handling of the plate precursor (during manufacture, packaging, transportation, exposure etc.) without tearing the layers.

U.S. Pat. No. 3,458,311 describes the coating of the water-soluble overcoat in the presence of a water-miscible organic solvent for rendering it adhesive.

In U.S. Pat. Nos. 4,072,527 and 4,072,528 it is claimed that in addition to the overcoat polymers dissolved in water, water-insoluble polymers are dispersed to improve the adhesion:

EP-A-275 147 describes amphoteric compounds as additives to water-soluble layers for improving adhesion.

DE-A-197 32 902 claims adhesive polymeric additives to overcoats on radiation-sensitive layers.

EP-A-403 096 claims overcoats comprising at most 20 wt.-% of the photoinitiators used in the radiation-sensitive layer. This serves to improve thermal stability and light-sensitivity.

EP-A-354 475 claims dyes in water-soluble overcoats which absorb light in the range of from 300 to 700 nm and have an absorption gap within this range corresponding to the emission range of the desired copying light source. It is demonstrated that such overcoats improve the resolution of the printing form. A similar effect is described in EP-A-465 034 with respect to polymerization inhibitors in the overcoat.

EP-A-352 630 protects the combination of a water-soluble polymer with a low degree of permeability to atmospheric oxygen and a water-soluble polymer which binds atmospheric oxygen for the improvement of storage stability. As polymers which bind atmospheric oxygen, this patent mentions polymers having aliphatic amino groups, preferably of the polyalkylene imine type.

As polymeric inorganic binders for the overcoat according to the present invention, water-soluble polymers such as for example polyvinyl alcohol, partly saponified polyvinyl acetate which may also contain vinylether and vinyl acetate units, polyvinyl pyrrolidone and its copolymers with vinyl acetate and vinyl ethers, hydroxyalkyl cellulose, gelatin, polyacrylic acid, gum arabic, polyacrylamide, dextrin, copolymers of alkylvinyl ethers and maleic acid anhydride, as well as water-soluble high-molecular polymers of ethylene oxide with molecular weights above 5000 are especially suitable. Preferably, the binder is selected from polyvinyl alcohol, polyvinyl pyrrolidone and mixtures thereof. Preferably, the amount of binder in the overcoat is between 50 and 99.9 wt.-%.

The radiation-absorbing component contained in the overcoat according to the present invention is characterized in that it absorbs in the long-wave flank of the absorption band of the photoactive system of the printing form precursor which absorbs at 300 to 500 nm since the long-wave absorption edge of the photoactive system of the printing form precursor is responsible for the decreased stability of the printing form precursor vis-a-vis daylight or similar conditions; in other words, the flank of the absorption band of the photoactive system with the longest wavelength overlaps with the absorption band of the radiation-absorbing component of the overcoat. The required properties of the radiation-absorbing component contained in the overcoat are achieved if its absorption maximum with the longest wavelength is at or below 550 nm and the difference between the absorption maximum with the longest wavelength of the radiation-absorbing component of the overcoat and the absorption maximum with the longest wavelength of the radiation-absorbing layer of the printing form precursor is in the range of 5 to 200 nm. It is especially preferred that the absorption maximum with the longest wavelength of the radiation-absorbing component contained in the overcoat is at or below 480 nm; preferably the difference between the absorption maximum with the longest wavelength of the radiation-absorbing component of the overcoat and the absorption maximum with the longest wavelength of the radiation-absorbing layer of the printing form precursor is in the range of 5 to 130 nm. Preferably, the radiation-absorbing component absorbs in the range of from 550 to 350 nm.

On the one hand, the solubility of the radiation-absorbing component in the coating solution for the overcoat is decisive for the selection of the radiation-absorbing component, on the other hand, there must not be any chemical interaction with components of the radiation-sensitive layer. Yellowish, yellow, orange and red compounds are suitable which, due to suitable sulfonic acid groups, are sufficiently soluble in water or aqueous-organic solutions. Especially preferred are sulfonated azo dyes. The radiation-absorbing component of the overcoat is not a photoinitiator, i.e. compounds which generate free radicals upon impact of actinic radiation, but "inert" dyes which do not enter a photoreaction.

A suitable amount of the radiation-absorbing component in the overcoat to impart a stabilizing effect under daylight or similar conditions can easily be determined by means of experiments known to the person skilled in the art. The amount is preferably in the range of 0.1 to 20 wt.-%, more preferably in the range of 0.5 to 5 wt.-%.

The water-soluble overcoat of the present invention is applied by means of surface coating processes well-known to the person skilled in the art, such as for example knife coating, roller coating, slot coating, curtain coating, spraying or dipping processes. The dry layer weight depends on the intended application and usually lies in the range of from 0.05 to 10/m$^2$, preferably 0.08 to 2.5 g/m$^2$.

In many cases, it is favorable to apply the water-soluble overcoats from aqueous solutions. This will cause the least damage to the environment and humans. However, for certain applications it may also be convenient to use organic solvents in combination with water since this improves the adhesion on the radiation-sensitive printing layer. In some radiation-sensitive layers, an addition of 0.5 to 50 wt.-% of an organic solvent will improve the adhesion. Such solvent additives may be e.g. alcohols, glycol ethers, glycol esters or ketones.

In order to carry out the wetting of the radiation-sensitive layer to be coated quickly and evenly, anionic, kationic or nonionic wetting agents can be added to the coating solutions. The type and amount of wetting agent are to be determined on the basis of the recommendations of the manufacturers of such agents by means of suitable experiments. The surface properties can additionally be influenced by the addition of rheological additives like flow improvers or thickening agents such as for example hydroxymethyl cellulose, gelatin, gum arabic or polyvinyl pyrrolidone.

To make up for the unwanted formation of foam caused by the components of the coating solution and turbulence as well as by air entering during the coating step, commercially available defoaming agents, such as silicone-containing compounds, can be added. Furthermore, plasticizers and inhibitors for the photoreaction can be present as additives.

For certain applications, the water-soluble overcoats can comprise particles having a size in the range of from 0.05 to 50 μm, preferably 0.5 to 20 μm. This way, certain optical effects may be achieved such as dimness, increased mechanical strength and an improved contact to film patterns in the vacuum printing frame when they are used in printing plate precursors. Such particles can consist of organic substances, preferably polymers, inorganic materials such as silica, aluminum oxide etc. or inorganic substances whose surface has been organically modified.

As radiation-sensitive printing layer, basically all positive and negative working printing layers known in the prior art can be used, preferably those on the basis of free radical polymerizable systems. In the latter, the overcoats according to the present invention also serve to hold back the inhibiting atmospheric oxygen.

The preferred radiation-sensitive printing layers comprise photoinitiators absorbing in the range of from 300 to 500 nm, free radical polymerizable components and optionally alkali-soluble binders and additives.

The free radical polymerizable component of the inventive mixture is often an acrylic or methacrylic acid derivative with one or more unsaturated groups, preferably esters of acrylic or methacrylic acid in the form of monomers, oligomers or prepolymers. It can be present in solid or liquid form with solid and viscous forms being preferred. Suitable monomers include, for example, trimethylolpropane triacrylate and methacrylate, pentaerythritol triacrylate and methacrylate, dipentaerythritol monohydroxypentaacrylate and methacrylate, dipentaerythritol hexaacrylate and methacrylate, pentaerythritol tetraacrylate and methacrylate, ditrimethylolpropane tetraacrylate and methacrylate, diethylene glycoldiacrylate and methacrylate, triethylene glycol diacrylate and methacrylate or tetraethylene glycol diacrylate and methacrylate. Suitable oligomers and prepolymers include for example urethane acrylates and methacrylates, epoxy acrylates and methacrylates, polyester acrylates and methacrylates, polyether acrylates and methacrylates, polymeric urethane acrylates or unsaturated polyester resins.

Polymeric additives can be employed for improving the mechanical stability of the layers and for reducing the adhesiveness. Especially suitable are acrylic binders which optionally contain polar groups such as carboxy groups, hydroxyalkyl groups and the like.

The parent substances or derivatives of acetophenone, benzophenone, (trichloromethyl)-1,3,5-triazine, benzoin, benzoin ethers, benzoin ketals, xanthone, thioxanthone, acridine or hexarylbisimidazole are preferred as photoinitiators for the photosensitive compositions.

The photoinitiators and free radical polymerizable components are to be combined in a manner known to the person skilled in the art, wherein combinations of different photoinitiators and different free radical polymerizable components are advantageous. The amount of photoinitiators is preferably 0.5 to 20 wt.-% and that of the free radical polymerizable components 5 to 80 wt.-%, based on the total solids content of the photosensitive compositions.

Furthermore, exposure indicators, e.g. selected from triarylmethane dyes (such as Victoria Pure Blue BO, Victoria Blue R, crystal violet), azo dyes (such as 4-phenylazodiphenylamine, azobenzene or 4-N,N-dimethylaminoazobenzene) or leuco dyes (e.g. leuco dyes of triarylmethanes such as tris-(4-diaminophenyl)methane) can be added to the radiation-sensitive layers. The amount of exposure indicators in the radiation-sensitive mixture is preferably 0.02 to 10 wt.-%, more preferably 0.5 to 6 wt.-%.

Dyes can be added to the radiation-sensitive layers to increase the contrast of the image, namely those dyes which dissolve in the solvent or solvent mixture used for coating or which can be introduced as pigment in disperse form. Suitable contrast dyes include, inter alia, triphenylmethane dyes, rhodamine dyes, anthraquinone pigments and phthalocyanin dyes or pigments.

The radiation-sensitive layers can furthermore comprise a plasticizer. Suitable plasticizers include, e.g. dibutyl phthalate, triarylphosphate and dioctyl phthalate. Dioctyl phthalate is especially preferred. The plasticizer is preferably present in an amount of 0.25 to 2 wt.-%.

The inventive on press developable printing form precursors are preferably used for offset printing. Metal foils or plastic films can be used as carriers. The use of aluminum carrier material is especially preferred. For its use as a carrier, aluminum is first grained by brushing in a dry state, brushing with abrasive suspensions or electrochemically, e.g. in a hydrochloric acid electrolyte. The grained plate precursors, which have optionally been anodically oxidized in sulfuric or phosphoric acid are then preferably subjected to a hydrophilizing after treatment in an aqueous solution of polyvinyl phosphonic acid, sodium silicate, phosphonic acid or the like. Details of the above-mentioned pretreatment of the substrate are known to the person skilled in the art.

The dried plate precursors are then coated with radiation-sensitive layers of organic solvents or solvent mixtures such that dry layer weights preferably in the range of 0.3 to 4 $g/m^2$, more preferably 0.6 to 3 $g/m^2$, are obtained. Then coating with the inventive overcoat is carried out.

The thus produced printing plate precursors are exposed in the usual manner known to the person skilled in the art. For developing the exposed printing form precursor on the printing press, a certain order depending on the type of the radiation-sensitive layer has to be observed. Often the exposed printing form precursor is first dampened with a fountain solution for several rotations of the impression cylinder, then the ink rolls are added and after a few more rotations of the impression cylinder, the feeding of paper is started. After a few sheets of paper, proper copies are obtained most of the time. Depending on the radiation-sensitive system used, the application of fountain solution, ink and paper can also be carried out in a different order. The printing plate precursors according to the present invention can both be positive working and negative working printing plate precursors.

The invention is described in more detail with reference to the following examples.

EXAMPLES

Example 1

A solution for a photosensitive layer is prepared from the following components:

| | |
|---|---|
| 0.121 g | 2,6-di-tert.-butyl-4-methylphenol |
| 0.04 g | Irganox 1035 (antioxidant from Ciba-Geigy) |
| 9.64 g | Paraloid A11 (poly(methylmethacrylate) from Rohm & Haas) |
| 1.61 g | isopropylthioxantone |
| 2.89 g | Ebecryl 8301 (urethane acrylate from UCB) |
| 20.1 g | dipentaerythritol pentaacrylate |
| 3.85 g | Pluronic L42 (polyoxypropylene-polyoxyethylene copolymer from BASF) |
| 1.61 g | 1-(4'-methoxyphenyl)-3,5-bis-trichloromethyl-1,3,5-triazine |
| 60 g | of a 50% solution of a binder with unsaturated side groups, prepared from methylmethacrylate, butylmethacrylate, maleic acid anhydride, hydroxybutylacrylate and m-isopropenyl-α,α-dimethylbenzylisocyanate according to preparation example 1 of U.S. Pat. No. 5,556,924 |
| 1.61 | bis (4-diethylamino-o-tolyl) (4-diethylaminophenyl)methane |
| 1.04 g | tris-(4-diaminophenyl)methane |

These components are dissolved under stirring in a mixture comprising:

| | |
|---|---|
| 558 g | methyl ethyl ketone and |
| 70 g | n-butanol |

After filtering, the solution is applied by means of a common process to an electrochemically grained and anodized aluminum foil which has been subjected to an after treatment with an aqueous solution of polyvinyl phosphonic acid and the layer is dried for 5 minutes at 90° C. The dry weight of the copying layer is about 1.1 g/m². Then the overcoat having a dry layer weight of 0.21 g/m² is applied analogously by coating with a solution having the following composition:

---

10.6 g Airvol 603 (polyvinyl alcohol from Airproducts),
71.2 g a 1.67% aqueous solution prepared from poly(ethylene-co-maleic acid anhydride), 4-amino-TEMPO and TAURIN according to the synthesis formula in US-A-5,599,650,
0.61 g sodium gluconate
0.145 g Triton X-100 (surface-active agent from Rohm & Haas),
0.086 g Aerosol OT (surface-active agent from Cytec Inc. pre-dissolved in 1 g of a 1:1 mixture of methanol in water),
1.65 g sodium polymetaphosphate and
0.144 g Metanil Yellow (C.I. 13065; sulfonated azo dye)

---

Drying was also carried out for five minutes at 90° C.

The copying layer is exposed by means of a metal halide lamp (MH-Burner, company Sack) with 170 mJ/cm² under a silver film half-step wedge with a density range of 0.15 to 1.95, wherein the density increments are 0.15, as a negative copy.

The plate precursor is mounted in a sheet-fed offset press and pre-wet with fountain solution for 15 rotations of the impression cylinder. Then the ink rolls are added and after another 15 rotations of the impression cylinder paper is fed into the press. After five sheets of paper, clean copies are obtained. The number of gray wedges are read off the printed sheet.

In order to examine its stability vis-á-vis sunlight, an unexposed printing plate precursor manufactured as described above is exposed by means of a 250 W Xenon lamp under a silver film half-step wedge with a density range of 0.15 to 1.95, wherein the density increments are 0.15 for 10 and 60 minutes, respectively. A Xenon lamp was selected because its emission is very similar to the solar spectrum.

In order to determine its sensitivity to room light, the plate precursor was exposed to a 1 m white fluorescent tube at a distance of 1 m. It was determined for how long exposure may take place without layer residues remaining on the printing press after developing.

The results are shown in Table 1.

Examples 2 to 4 and

Comparative Example 1

The same radiation-sensitive layer as in Example 1 is used, however, the radiation-absorbing component in the overcoat is modified according to the values given in Table 1.

The results are shown in Table 1. It turns out that no negative influence of the dyes in the overcoat according to the present invention on the UV-sensitivity of the on press developable printing form precursors can be verified. However, the white light stability of on press developable printing plate precursors comprising the inventive overcoat, expressed in terms of Xenon lamp sensitivity or sensitivity to light from white fluorescent tubes, has been markedly improved. Irradiation with Xenon light for 10 minutes does not result in pre-exposure in the printing plate precursors of the present invention while in the comparative example already 2 steps of the gray wedge are shown. Similarly, the stability of the inventive printing form precursors vis-á-vis white fluorescent tubes has been improved. The inventive printing form precursors are stable for more than 120 minutes, while the control form precursors showed layer residues during printing after only 30 minutes.

TABLE 1

| No. | Radiation-absorbing component in the overcoat[1] | Exposure with metal halide lamp, 170 mJ/cm² | | Exposure with 250 W Xenon lamp[3] partially covered gray wedge steps | Exposure with white fluorescent tube[2] |
| --- | --- | --- | --- | --- | --- |
| | | completely covered gray wedge steps | partially covered gray wedge steps | | |
| Example 1 | 0.144 g Metanil Yellow C.I. 13065 | 3 | 7 | 3/0 | >120 min, i.e. light-resistant |
| Example 2 | 0.29 g Acid Red 483 K PINA from Allied Signal | 3 | 7 | 4/0 | >120 min, i.e. light-resistant |
| Example 3 | 0.29 g Oxonol Yellow K PINA from Riedel-de-Haen | 3 | 7 | 4/0 | >120 min, i.e. light-resistant |
| Example 4 | 0.29 g Acid Yellow UV375 PINA from Riedel-de-Haen | 3 | 7 | 4/0 | >120 min, i.e. light-resistant |
| Comparat. Example | none | 3 | 7 | 6/2 | after 30 min layer residues on printing press after development |

[1] amounts refer to formulations in Example 1
[2] fluorescent tube with a length of 1 m, distance between plate precursor and fluorescent tube 1 m
[3] The first value corresponds to an exposure duration of 60 min, the second one to an exposure duration of 10 min

We claim:

1. A printing plate precursor comprising a carrier, a radiation-sensitive printing layer and an overcoat, wherein the overcoat comprises:

(a) at least one polymeric organic binder, soluble in water or in organic solvents having a water content of at least 50 wt.-% based on the total solvent content; and (b) at least one radiation-absorbing component wherein the absorption maximum with the longest wavelength of the radiation-absorbing component of the overcoat is at or below 550 nm, the radiation-absorbing component absorbs in the range on the long wavelength side of the maximum of the absorption band of the photoactive system of the printing plate precursor and the difference between the absorption maximum with the longest wavelength of the radiation-absorbing component of the overcoat and the absorption maximum with the longest wavelength of the radiation-sensitive layer of the printing plate precursor is in the range of 5 to 200 nm.

2. The printing plate precursor according to claim 1 wherein the polymeric organic binder is selected from the group consisting of poly(vinylalcohol), poly(vinylpyrrolidone) and mixtures thereof.

3. The printing plate precursor according to claim 1 wherein the radiation-absorbing component is at least one water-soluble azo dye.

4. The printing plate precursor according to claim 1 wherein the overcoat has a dry weight of 0.05–10 g/m$^2$.

5. The printing plate precursor according to claim 1 wherein the overcoat additionally comprises organic or inorganic particles having a size of from 0.05 to 50 μm.

6. The printing plate precursor according to claim 1 wherein the difference between the absorption maximum with the longest wavelength of the radiation-sensitive component of the overcoat and the absorption maximum with the longest wavelength of the radiation-sensitive layer of the printing plate precursor is in the range of 5 to 130 nm.

7. The printing plate precursor according to claim 1 wherein the printing plate precursor comprises a radiation-sensitive printing layer on the basis of free radical polymerizable systems.

8. The printing plate precursor according to claim 1 wherein the overcoat comprises 0.1 to 20 wt.-% of a radiation-absorbing component.

9. The printing plate precursor according to claim 1 wherein the carrier is a pretreated aluminum carrier.

10. The printing plate precursor according to claim 1 which is an offset printing plate precursor.

11. The printing plate precursor according to claim 1 wherein the printing plate precursor can be developed on a printing press.

12. The printing plate precursor of claim 1, wherein the overcoat comprises at least one additional component selected from the group consisting of adhesives, wetting agents, inhibitors, fillers, plasticizers, flow improvers, thickeners and antifoaming agents.

* * * * *